(12) United States Patent
Alonso et al.

(10) Patent No.: US 12,503,758 B2
(45) Date of Patent: Dec. 23, 2025

(54) METHOD AND APPARATUS FOR PROCESSING THIN FILMS ON SUBSTRATES

(71) Applicant: Comptek Solutions Oy, Turku (FI)

(72) Inventors: Vicente Calvo Alonso, Piispanristi (FI); Jouko Lång, Lieto (FI)

(73) Assignee: Comptek Solutions Oy, Turku (FI)

( * ) Notice: Subject to any disclaimer, the term of this patent is extended or adjusted under 35 U.S.C. 154(b) by 0 days.

(21) Appl. No.: 18/625,601

(22) Filed: Apr. 3, 2024

(65) Prior Publication Data
US 2025/0313946 A1   Oct. 9, 2025

(51) Int. Cl.
C23C 16/455 (2006.01)
C23C 16/02 (2006.01)

(52) U.S. Cl.
CPC ...... *C23C 16/0209* (2013.01); *C23C 16/0227* (2013.01); *C23C 16/0272* (2013.01); *C23C 16/45519* (2013.01); *C23C 16/45536* (2013.01); *C23C 16/45544* (2013.01)

(58) Field of Classification Search
CPC .............. C23C 16/029; C23C 16/0227; C23C 16/0272; C23C 16/45519; C23C 16/45536
See application file for complete search history.

(56) References Cited

U.S. PATENT DOCUMENTS

| | | | |
|---|---|---|---|
| 2002/0068458 A1* | 6/2002 | Chiang | C23C 16/45536 257/E21.582 |
| 2005/0239297 A1* | 10/2005 | Senzaki | H01L 21/02178 438/785 |
| 2014/0273493 A1* | 9/2014 | Limdulpaiboon | H01L 21/02175 438/723 |
| 2014/0273519 A1* | 9/2014 | Prokes | H01L 21/0226 438/778 |
| 2017/0309521 A1* | 10/2017 | Yoon | H01L 21/823487 |
| 2019/0326114 A1* | 10/2019 | Kachian | H01L 21/02639 |
| 2020/0395222 A1* | 12/2020 | Woods | H01L 21/0206 |

FOREIGN PATENT DOCUMENTS

| | | | | |
|---|---|---|---|---|
| WO | WO 2007/024720 A2 * | 3/2007 | | H01L 21/31 |
| WO | WO 2007/087345 A2 * | 8/2007 | | |

OTHER PUBLICATIONS

De Paula, Camila, et al., "Mechanistic Study of Nucleation Enhancement in Atomic Layer Deposition by Pretreatment with Small Organometallic Molecules". Chemistry of Materials, 2020, 32, 315-325.*

Strehle, S. et al., "Effect of wet chemical substrate pretreatment on the growth behavior of Ta(N) films deposited by thermal ALD". Microelectronic Engineering 85 (2008) 2064-2067.*

(Continued)

*Primary Examiner* — Bret P Chen
(74) *Attorney, Agent, or Firm* — Ziegler IP Law Group, LLC.

(57) ABSTRACT

The processing of the surface of a substrate to grow a high-quality thin film layer with Atomic Layer Deposition (ALD) includes first preparing the substrate surface and then creating an improved interface layer on the surface of the substrate prior the ALD growth. These processes are achieved within a single processing equipment.

10 Claims, 9 Drawing Sheets

(56) References Cited

OTHER PUBLICATIONS

Xu, Min, et al., "Effect of Trimethyl Aluminum Surface Pretreatment on Atomic Layer Deposition Al2O3 Ultra-Thin Film on Si Substrate". Chin. Phys. Lett., vol. 22, No. 9 (2005) 2418-2421.*
Merdzhanova, T., et al., "Single-chamber processes for a-Si:H solar cell deposition". Solar Energy Materials & Solar Cells 98 (2012) 146-153.*

* cited by examiner

METHOD AND APPARATUS FOR PROCESSING THIN FILMS ON SUBSTRATES

TECHNICAL FIELD

The aspects of the disclosed embodiments related to a process and apparatus for manufacturing a semiconductor device. In particular, the aspects of the disclosed embodiments relate to a method to produce the highest quality interface between a substrate and a thin film grown by ALD on a semiconductor substrate, especially on a compound semiconductor substrate, by first preparing the substrate, and then creating an improved interface layer prior to the ALD growth, and these processes happen in the same processing chamber/processing reactor equipment.

BACKGROUND

A compound semiconductor substrate is a semiconductor substrate, wafer, or an epitaxially fabricated structure which contains compound semiconductor materials. Compound semiconductors are classified according to the elemental groups of their constituents in the periodic table. In general, these compounds can be categorized as binary, ternary or quaternary etc. alloys depending on the number of different atomic constituents making the semiconductor crystal. For example, GaAs, GaN, SiC, AlGaN and InAlGaP. In this context, the substrate could present structural patterns on one of the surfaces that define electronic devices such as transistors, microLEDs, vertical cavity surface emitting laser (VCSEL), photodetectors or diodes etc.

Atomic layer deposition (ALD) is a technique to fabricate conformal and uniform inorganic thin films of material with atomic layer precision. The technique involves half-cycle reactions in which the precursors gases are purged into the reaction chamber and to the substrate in cycles. The reactions are self-terminating, i.e. only one layer of the desired material is attached to the target surface during one reaction cycle. When the other reactant is introduced to the surface, it reacts with the previous precursor reactant and the by-products/non-reacted reactants are removed. Thus, the film grows ideally one atomic layer per half-cycle and the ALD is highly controlled thin film fabrication method.

Amorphous native oxides are oxides of the substrate material, naturally formed on the surface of the semiconductor whenever it is exposed to an oxygen source, such as air. These oxides are characterized by structural disorder, partially filled dangling bonds as well as dimer- and compound semiconductor oxide bonds and thus high-density defects and the related states in the band gap of the semiconductor. These defects result in detrimental characteristics such as Fermi-level pinning, high surface recombination velocity and leakage current among the other things and in general poor electrical properties detrimental to the semiconductor device performance.

Long-range ordered oxides/Highly ordered native oxides/ordered native oxides/long-range ordered native oxides are crystalline oxides which have a long-range order, and the surface atoms have translational symmetry similar or different compared to compound semiconductor substrate (whereas amorphous oxides consist of structures of irregular shape and have short-range order only). Highly ordered native oxides of a material are oxides formed on the surface of the material when exposed to some source of oxygen and that present long-range order, or crystalline arrangement.

As compound semiconductors are known to suffer from aggressive oxidation as soon as they are exposed to any source of oxygen, such as air, and as the native oxides formed are of amorphous nature, they present high levels of surface defect states. It is important to get rid of these bad quality oxides prior to the growth of thin films/prior thin film growth.

Generating highly ordered native oxides i.e. long-range ordered oxides, which are crystalline and present very low levels of surface defect states, helps to improve the quality of the interfaces between materials, and therefore the quality of the thin film grown on top of the compound semiconductor material.

In semiconductor industry, substrates are subjected to multiple and complex processes to produce all the functional layers that will provide the desired properties of the final chips produced from those substrates.

Many of those processes consist of depositing and growing functional layers or coatings via some thin film deposition technique, such as Chemical Vapour Deposition (CVD) or Atomic Layer Deposition (ALD). Thin film depositions are used to generate conformal barriers, high-k dielectrics, gate dielectrics, tunnel dielectrics and etch stop layers for semiconductor devices. ALD films, in particular, are thermally stable and very uniform which makes them attractive for optoelectronic, power electronic and radio frequency applications.

To achieve the necessary high-quality functionality, the surfaces of the substrates need to be treated to remove contaminations and other defects derived from bad quality amorphous native oxides, prior the thin film growth.

It is well known that especially compound semiconductors are prone to oxidize aggressively, resulting in the immediate formation of a layer of amorphous native oxides that are characterized by high levels of defect state density, or surface defects, that hinder the performance of the semiconductor device. Surface preparation steps are usually performed to remove these defects by eliminating the amorphous native oxides, for example processes such as dry or wet etching techniques. After the cleaning step, an interface deposition step could be applied, where an interface material that will serve as a base for the thin film growth is created or deposited. For example, this layer could be a few monolayers of AlN grown prior to the deposition of Al2O3.

All these processing steps usually happen in different equipment. When transferring the extremely sensitive substrates from one process to another, there is a high risk of reoxidation of the clean substrate surface, or the appearance of contamination coming from the ambient atmosphere. For this reason, a common approach is to make the transfer of the substrate from one equipment/processing chamber to another, via some sort of vacuum or inert gas transfer line. Furthermore, it is known in the art that unless the transfer happens in ultra-high vacuum (UHV) environment, the oxidation of compound semiconductor substrates always happens to certain extent.

In the existing methods for providing the substrate surface with the functional layer, all process steps—the surface preparation, the interface step and the step for providing the functional material layer—are carried out in separate equipment. At least two different processing chambers/equipment are needed to carry out all these three steps.

After preparing the substrate, it needs to be transferred to the thin film growing equipment, and during the transfer the substrate is exposed to oxygen.

Figure 1:
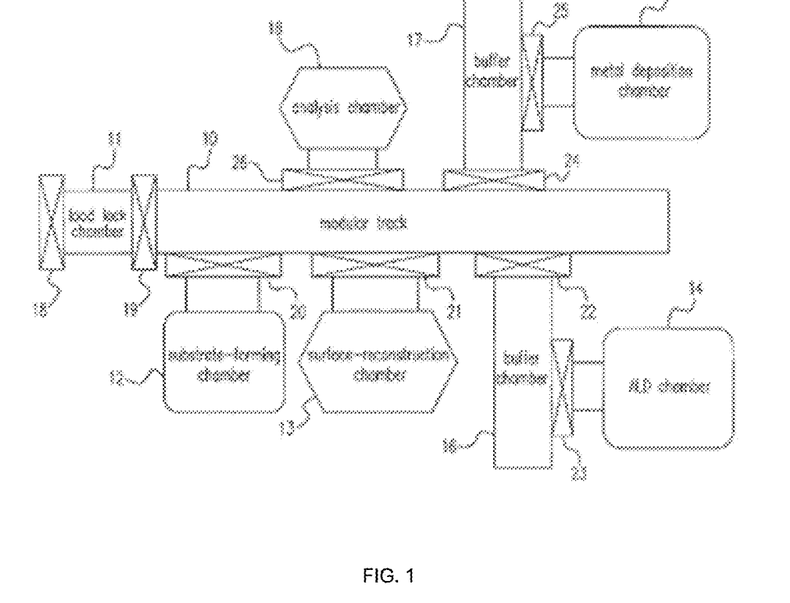
FIG. 1: is a diagram of a prior art system, where multiple processing chambers are interconnected with a modular track to transfer samples i.e. substrates (for example compound semiconductor substrates) from one chamber to another. Source: U.S. Pat. No. 8,859,441 B2
Figure 2:
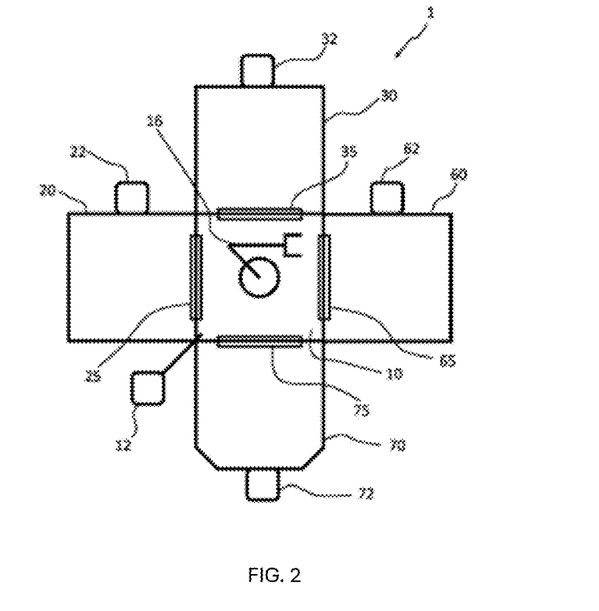
FIG. 2: shows a prior art system, where there are multiple processing reactors connected to a transport chamber Source: FI129628B/US 2022/0356561 A1

To overcome these challenges, the industry has used cluster tools, where all required processing equipment is interconnected via some kind of transfer mechanism that is kept under vacuum conditions to reduce the exposure to oxygen to the minimum. This results in very big and complex systems that make the production process slower and not efficient enough in terms of quality and productivity. And, as explained earlier, the presence of oxygen during every processing step is unavoidable in higher or smaller amount—native amorphous oxides will still be formed on the surfaces of the compound semiconductor. (FIG. 1 and FIG. 2 are examples of cluster tools)

Concerning the ALD process itself, there are known approaches to improve the quality of interfaces between compound semiconductors and the dielectric films grown on top of it. These approaches include the use of multiple steps, (cleaning, deposition of interface layer or multiple layers, etc) but all these approaches always require the use of cluster tools with at least 2 different processing chambers.

Figure 4A:
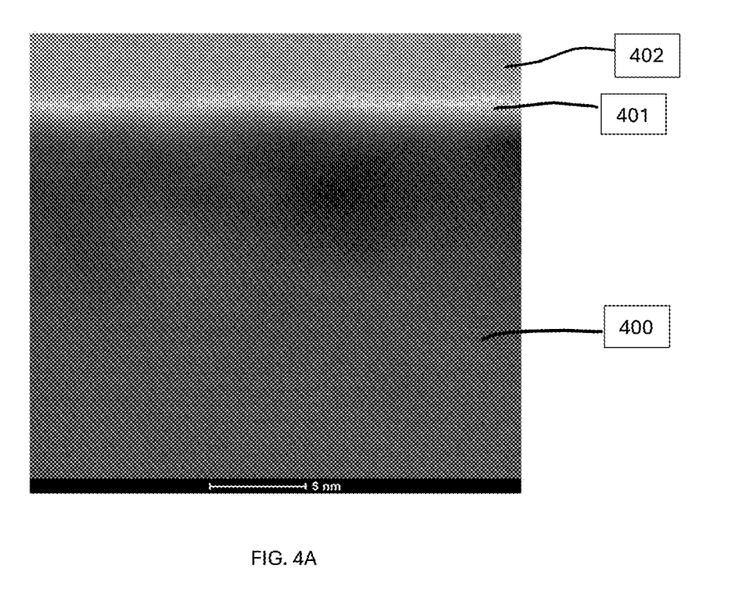
FIG. 4A: show a high-resolution transmission electron microscope (HRTEM) image of the amorphous native oxide interface between a compound semiconductor and a thin film layer. Source: R&D/Comptek Solutions

Additionally, when growing thin films on compound semiconductors, by ALD process in particular, we have demonstrated that the oxygen levels present in the equipment (at very low base pressure levels), or contained in either the precursors or the oxidation agent, will react immediately with the clean substrate surface, generating a non-optimal interface of amorphous native oxides between the compound semiconductor and the dielectric layer grown by ALD (FIG. 4A). This is a very important issue for devices such as transistors, where the quality of the interfaces between different materials in the semiconductor stack have a direct impact on the performance of the final product.

It is also known that ALD growth technique is particularly slow, and it is well known for having an important carbon footprint. ALD processes make use of chemical reactions of gaseous reactants in a vacuum chamber to obtain a coating with defined properties at the surface of a substrate, and they require considerable amounts of chemicals, they generate excess of by-products, and they require considerable amount of electricity.

There is a need to improve further the quality of interface between substrate and thin films grown by ALD on compound semiconductors as well as to improve the compound semiconductor-ALD interface quality and furthermore to simplify and reduce the amount of equipment needed and to reduce the amounts of electricity and chemicals used.

Figure 4B:
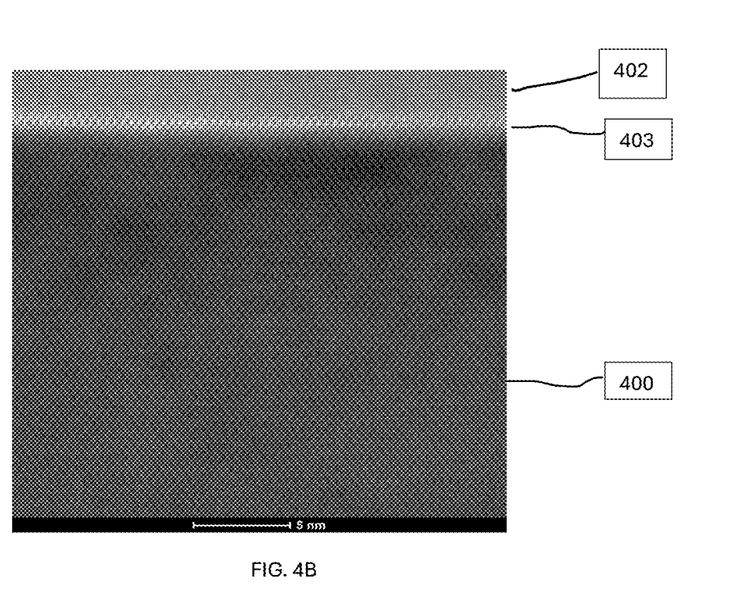
FIG. 4B: shows a high-resolution transmission electron microscope (HRTEM) image of a long-range ordered oxide interface layer between a compound semiconductor and a thin film layer. Source: R&D/Comptek Solutions

A known passivation method for compound semiconductor materials consists in creating long-range ordered oxide structures on the surface of the substrate (Laukkanen et al., Method for treating a substrate and a substrate, U.S. Pat. No. 9,269,763). These long-range ordered oxide structures have been proven to be stable and protect against further exposure to the atmosphere. Additionally, we have demonstrated how these structures help to create a high-quality interface between the compound semiconductor and the ALD grown layer (FIG. 4B).

One benefit of using long-range ordered oxides prior the growth of the thin film, is that as they reduce the amount of the atomic level defects in the interface, the amount of leak current that goes through the stack (ALD grown insulator/dielectric material—passivation layer—compound semiconductor) is lower than the levels obtained without passivation layer. This means that the minimum thickness required for the isolation material to obtain similar performance can be decreased. This helps to reduce the required thin film thickness grown by ALD, thus reducing the amount of chemicals used, electricity, waste generation etc.

Currently, the combination of this passivation process and ALD is also performed either by using separate equipment, or equipment combined in clusters due to the differences of processing conditions.

SUMMARY

The aspects of the disclosed embodiments are based on the idea of providing a method and apparatus to produce the highest quality of interface between the thin film grown by ALD and the compound semiconductor substrate, by implementing an improved process that includes a preparation step and a surface passivation step, prior the ALD growth, with the novelty that all three process steps happen in the same processing chamber. The surface passivation step chosen for this method consists in generating a long range ordered oxide layer on the surface of the substrate prior to the thin film growth by ALD.

This process can be applied, for instance, to form Gate dielectric stacks in AlGaN/GaN metal-insulator-semiconductor high-electron-mobility-transistors (MIS-HEMT) to improve the interface between the transistor channel materials and the dielectric layer. This improved dielectric/compound semiconductor interface will result in better performance of the transistors, lower amount of leak currents through the gate dielectric, and eventually, as we have demonstrated, that it can allow to reduce the total thickness of the thin film required to keep a certain level of leak current (MARJUKKA TUOMINEN et al., Oxidation-Induced Changes in the ALD-$Al_2O_3$/InAs(100) Interface and Control of the Changes for Device Processing (ACS Publications, Dec. 3, 2018). Furthermore, by implementing such good quality interface the performance of enhancement-mode AlGaN/GaN HEMT in RF and power electronic applications can be greatly improved. In addition, such implementation will lead to a more sustainable ALD process, as the amounts of chemicals and electricity used to manufacture a chip can be decreased while keeping similar or better electrical characteristics.

According to a first aspect, the above and further aspects and advantages are obtained by a method for processing a surface of a substrate. In one embodiment the method is carried out in an apparatus with a single processing chamber, where all processing steps happen in the single processing chamber, the method comprising the following processing steps, a) a preparation step, b) a surface passivation step, and c) an ALD growth step, wherein the preparation step comprises treating a surface of the substrate to reduce contamination, carbon, hydrocarbons, water, and/or amorphous native oxides from the surface of the substrate; the surface passivation step comprises an oxidation process for generating high quality long-range ordered oxides on the surface of the substrate; the ALD growth step comprising growing a thin film by atomic layer deposition; wherein all of the processing steps happen within the single processing chamber.

In a possible implementation form the method further comprises adjusting process conditions between each processing step, where at least a substrate temperature, a processing chamber pressure and a processing chamber wall temperature are adjusted to levels required by each processing step.

In a possible implementation form the preparation step further comprises at least one or more of the following: a Dry-etching process to remove amorphous native oxides; annealing the substrate in a vacuum to remove adsorbed water and volatile atomic species from the surface of the substrate; and a surface stoichiometry modification step to obtain a specific concentration of elements at the surface of the substrate.

In a possible implementation form the preparation step comprises annealing the substrate in a vacuum to remove adsorbed water and volatile atomic species from the surface of the substrate.

In a possible implementation form the surface stoichiometry modification step consists in depositing a metal component to modify the substrate stoichiometry to have a higher concentration of elements to achieve a long-range ordered oxide in the surface passivation step.

In a possible implementation form the deposition of the metal component is done by introducing a chemical metal precursor in the processing chamber.

In a possible implementation form the deposition of the metal component is done by physical vapour deposition.

In a possible implementation form the stoichiometry modification step comprises only an annealing step of the substrate in at least high vacuum conditions.

In a possible implementation form the method further comprises using an inert gas curtain around ALD reactive gases and precursors to prevent an excess of the ALD reactive gases and precursors to reach a wall of the single processing chamber.

In a possible implementation form the substrate contains compound semiconductor material.

According to a second aspect, the above and further aspects and advantages are obtained by an apparatus for processing a surface of a substrate. In one embodiment the apparatus comprises a load lock, a processing chamber, and a transfer mechanism to transfer the substrate from the load lock to and from the processing chamber, wherein: the load lock comprises at least a substrate holding mechanism, a door and a pumping system that provides a vacuum and regulates a pressure of the load lock; wherein the load lock is separated from the processing chamber via a gate valve configured to isolate pressure conditions between the load lock and the processing chamber; wherein the process chamber comprises: a substrate holding mechanism, a substrate heating element, a pumping system to provide the vacuum and regulate the pressure of the processing chamber and provide the exhaust system of gases and precursors during processing steps, a chamber wall temperature regulation system, a gas delivery system, and a precursor delivery system; wherein the processing chamber is configured to achieve ultra-high vacuum conditions.

In a possible implementation form the apparatus is configured to adjust conditions to meet requirements of each of the processing steps for processing the surface of the substrate.

In a possible implementation form the load lock further comprises a substrate heating system.

In a possible implementation form the processing chamber has a double wall structure or built-in fluid channels through which a heating or cooling fluid is circulated to regulate the temperature of a chamber wall.

In a possible implementation form the processing chamber further comprises a Plasma source.

In a possible implementation form the processing chamber further comprises: an internal enclosure and a movable/retractable substrate holder and heater assembly that can be directed into the internal enclosure during a thin film growth step or retracted away; and the apparatus further comprises a moving shielding element that can isolate the internal enclosure from a heating source when the substrate holder and heater assembly is retracted, to prevent excessive heating during the passivation step In a possible implementation form the precursor delivery system and a gas manifold delivery system are arranged so that an inert gas curtain is provided around the precursor gas focused on the substrate and preventing the precursor gas from reaching walls of the processing chamber.

In a possible implementation form the ultra-high vacuum conditions comprise pressure conditions in the range of and below 5e−9 mbar.

DETAILED DESCRIPTION

A known passivation method for compound semiconductor materials consists in creating long-range ordered oxide structures on the surface of the substrate. These structures have been proven to be stable and to protect the substrate against further exposure to the atmosphere. In addition, we have demonstrated how these structures help to create a high-quality interface between the compound semiconductor and a thin film layer grown by ALD, for example. In FIG. 4A it is shown a cross section of a semiconductor stack with a thin film of Al2O3 (402) grown by ALD on top of a compound semiconductor material, in this case GaAs (400). Although the growth of ALD was done after cleaning the surface of GaAs (400) the oxygen present in the equipment, as well as the oxygen coming from the ALD process itself, oxidizes the substrate material forming a layer of amorphous native oxide (401). In FIG. 4B we show the same material, GaAs (400) on which a long-range ordered oxide is generated (403). This long-range ordered oxide shows high degree of crystallinity and constant thickness and creates a sharp interface between the substrate and the subsequent Al2O3 layer (402) grown on top of it.

Using these long-range ordered oxides prior the growth of the thin film reduces the amount of the atomic level defects at the interface and the amount of leak current that goes through the stack (ALD grown insulator/dielectric material-passivation layer-compound semiconductor) is lower than the levels obtained without passivation layer. This means that the minimum thickness required for the insulator material to obtain similar performance can be decreased. This helps to reduce the amount of growth by ALD, therefore also the amount of chemicals used, electricity, waste generation etc. reduces.

The aspects of the disclosed embodiments provides a solution consisting in an improved method to grow thin films by ALD with higher quality by combining three processes, and an apparatus where these three processes are performed within a single processing chamber (101):

Process Step 1: Preparation of the Substrate (108)

The surface of the substrate is prepared to obtain certain properties required to enable the subsequent second step. This preparation step could include removal of amorphous native oxides and contaminants by for example plasma treatments (dry etching processes), thermal annealing in UHV conditions etc., and/or modification of the substrate surface to get certain properties such as desired stoichiometry and surface reconstruction.

Process Step 2: Substrate Surface Passivation by Generating Long-Range Ordered Oxide Structure A substrate surface passivation layer is generated, and characterized in that it consists in forming a high-quality long-range ordered oxide structure, via creation of highly ordered oxides of the substrate.

Process Step 3: Thin Film Growth by ALD

A thin film is grown by atomic layer deposition (ALD) on top of the passivating layer. The ALD process could be for example thermal-, UV-assisted- or Plasma enhanced ALD.

Process Steps 1 and 3 have been previously produced in a single processing chamber, for example plasma enhanced ALD reactors etc., but processing steps 2 and 3 have never been combined into a single processing chamber as the processing conditions for each of these steps are significantly different:

The passivation step might require a high substrate temperature (e.g. 500° C.-1000° C.) to work, for example, on GaN or SiC substrates, compared to substrate temperature typically implemented during ALD growth (e.g. 100° C.-350° C.).

The vacuum levels required for each processing step are also quite different: generation of long-range ordered oxide structures might require up to ultra-high vacuum (UHV) base pressure conditions (<5e−9 mbar) in the processing chamber, while ALD usually requires only just medium vacuum conditions (1e−3 mbar).

Processing chamber wall temperature requirements are also different for both processes.

Typically, ALD processes are conducted at modest temperatures (<350° C.). The temperature range where the layer-by-layer growth is achieved depends on the specific ALD process and is referred to as the 'ALD temperature window'. Temperatures outside of the window generally result in poor growth rates and non-ALD type deposition due to effects such as slow reaction kinetics or precursor condensation (at low temperature) and thermal decomposition or rapid desorption of the precursor (at high temperature). This means that during the ALD process the temperature through the whole chamber should be as uniform as possible to ensure the high quality of the thin film growth, and to prevent precursor condensation in the chamber walls, they need to be heated up to, for example 150° C.-200° C.

In contrast for the passivation step, the ideal situation would be to keep the temperature of the chamber walls as low as possible to prevent the outgassing of contaminants from the chamber walls. Usually, UHV conditions and high temperatures promote the outgassing or release of gases/materials present in the chamber walls, such as water, and that could have a negative impact to the passivation step, as for example:

too high outgassing makes difficult to reach the required base pressure to obtain long-range ordered oxides on the surfaces contaminants released from the walls could be deposited on the substrate One aspect that should be considered in the processing chamber design is how to minimize the deposition or growth of precursors in the chamber walls.

The aspects of the disclosed embodiments provide a design of an apparatus capable to implement the full process, i.e. substrate surface preparation+surface passivation+ALD growth, with no need to transfer the substrate (108) between different processing chambers: maintaining the lowest contamination/oxidation levels on the substrate and obtaining the highest quality of the interface and consequently obtaining/resulting the highest quality of the thin film. Additionally, being able to do all process steps in a single processing chamber (101), with no need for transfer mechanisms between different equipment etc., the amount and size of equipment (needed) is also reduced. This represents significant cost savings for manufacturers.

During the surface preparation step the substrate surface is prepared to accommodate the interface layer, and it can include multiple subprocesses, for example, removing amorphous native oxides and/or removing contaminants, such as carbon, which are known to prevent the formation of subsequent step. This can be done by dry etching processes, e.g. with atomic hydrogen generated by Radio Frequency (RF) plasma or thermal cracker.

Additional surface preparation subprocesses could be applied to modify the surface stoichiometry so that it presents certain surface reconstruction and composition that would be beneficial for the subsequent passivation step. By modifying the stoichiometry of the substrate surface, it is possible to obtain a composition presenting higher concentration of certain elements, for example, from group III of the elemental periodic table, or from group V. This could be done by either adding or removing some of these elements. The concentration of these elements determines what types of long range order oxides can be obtained, as well as the process parameters that are needed to obtain them.

In one embodiment this could be done by thermal annealing in at least High Vacuum (HV) conditions, when the most volatile species could be evaporated from the surface. For example, in GaAs compounds, As and As-oxides will evaporate at lower temperatures than Ga, therefore it is possible to obtain certain Ga rich surface stoichiometry and reconstruction of the surface.

In another embodiment the surface preparation step would include a metal depositions step, where some metal element e.g. Sn, In, Ga, is deposited on the surface, with the purpose to functionalize and modify the surface stoichiometry and the surface crystalline reconstruction, to obtain a more beneficial surface structure for a particular compound semiconductor, to act as starting surface for the subsequent passivation step.

In one embodiment the metal deposition could be done by evaporation process, using for example effusion cells or E-beam evaporators. In another embodiment the metal could be deposited by means of introducing metal precursors into the processing chamber that will react and deposit on the substrate surface, similarly to Metal organic chemical vapour deposition (MOCVD) or ALD processes.

In the passivation step, an interface layer (passivation layer) is created on the surface of the substrate (108). The interface layer consists of a combination of native oxides of the forming compounds of the substrate surface and that present a long-range ordered structure.

It is known that these crystalline native oxides of compound semiconductors provide a stable passivation effect to the compound semiconductor surface. These long-range ordered oxides can be obtained, for example, by exposing the surface to certain amounts of oxidizing agent under certain pressure and temperature conditions which are specific for a particular compound semiconductor. The actual processing conditions depends on the reactivity of the oxidizing agent, exposure of the oxidizing agent measured by Langmuirs, and on the reactivity of the substrate surface determined by the preparation step (stoichiometry, reconstruction) and substrate temperature. Additionally, the chamber (101) needs to be designed to ensure that it is possible to achieve a base pressure of Ultra High Vacuum (UHV) level to enable the passivation step.

In one embodiment the oxidizing agent could be molecular oxygen. In another embodiment the oxidizing agent could be atomic oxygen generated by plasma. In another embodiment the oxidizing agent could be for example Ozone, H2O, H2O2, CO, CO2, NO, NO2 etc.

The thin film growth is achieved by atomic layer deposition, which is a well-known and widely used process. In one embodiment the ALD growth happens via a thermal ALD process. In another embodiment the ALD growth happens via Plasma enhanced ALD process. In another embodiment the ALD growth happens via UV assisted ALD.

Figure 5:
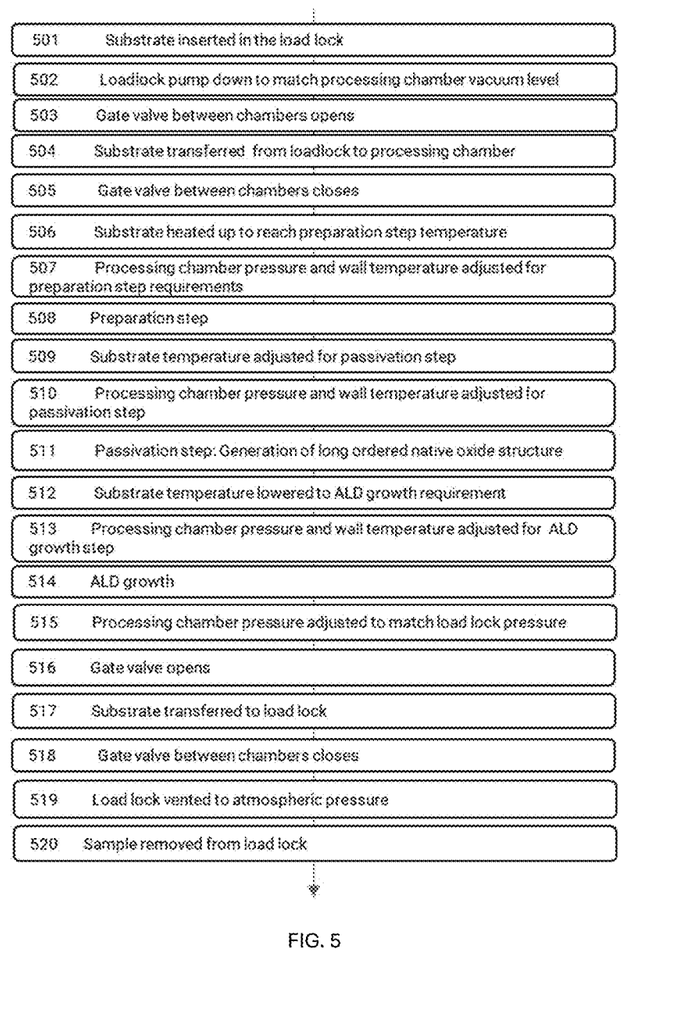
FIG. 5: shows an exemplary process flow diagram of the novel process according to the aspects of the disclosed embodiments.
Figure 6:
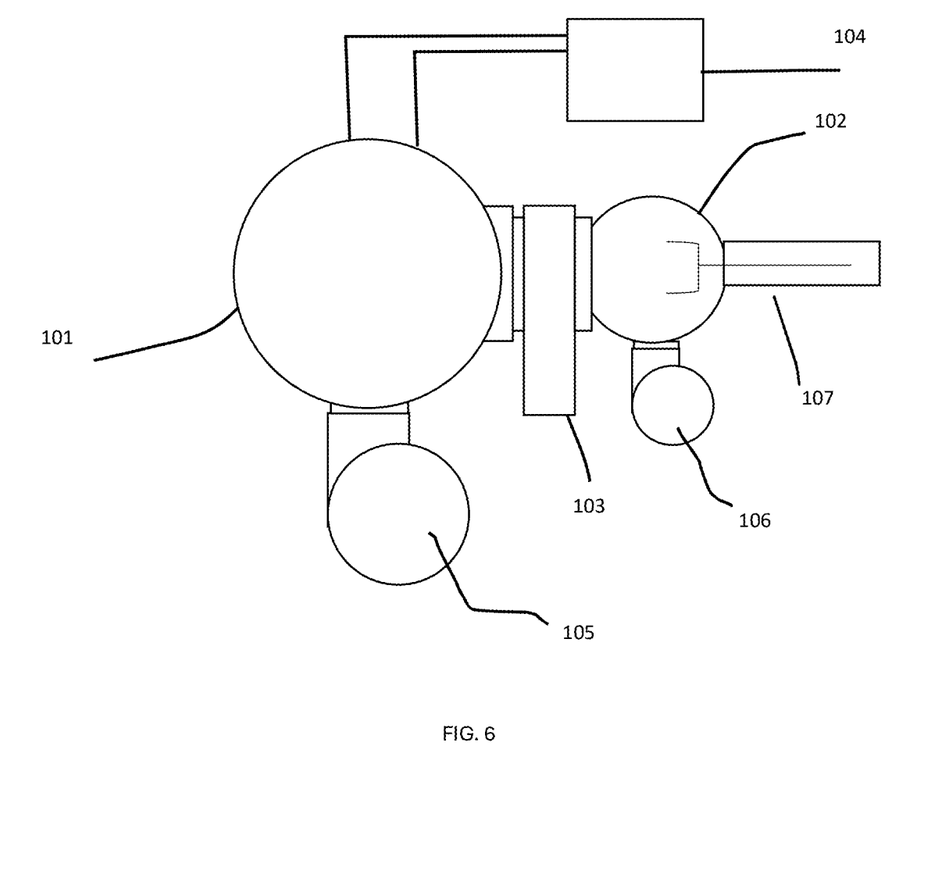
FIG. 6: shows a schematic of a tool to implement the full process in a single processing chamber.

The process in detail consists in at least (FIG. 5: flow chart):

501. Substrate (108) inserted in the load lock (102): Loading the sample (for example a compound semiconductor substrate) (108) into a loading chamber or load lock (102)
502. Load lock (102) pump down to match processing chamber (101) vacuum level: Loading chamber/load lock (102) is pumped down to reach the required vacuum level with a pumping system (106)
503. Gate valve (103) between chambers opens: gate valve (103) between load lock (102) and processing chamber (101), which is in the required vacuum level, opens.
504. Substrate (108) transferred from load lock (102) to processing chamber (101): substrate (108) is transferred to the processing chamber (101) via transfer mechanism (107), and substrate (108) is mounted onto the substrate holding mechanism (116). Transfer mechanism (107) is then retracted.
505. Gate valve (103) closes
506. The substrate (108) is heated up to with a heating element (109) in the substrate holding mechanism (116) until it reaches the preparation step temperature according to the required processing temperature.
507. Processing chamber (101) pressure and wall temperature adjusted for preparation step requirements: the required chamber pressure level is achieved by means of the pumping system (105), and the chamber wall temperature is regulated via the cooling/heating mechanism (114,115,117)
508. Preparation step: The substrate surface is modified by different processes to obtain certain characteristics. At least a high temperature annealing step in at least high vacuum conditions is carried out.
509. Substrate (108) temperature adjusted for passivation step. The temperature of the substrate (108) is set to a target temperature suitable for the following passivation step.
510. Processing chamber (101) pressure and temperature of the processing chamber (101) walls are regulated to the required temperature for the passivation step.
511. Passivation step: Generation of long-range ordered oxide structure. The passivation process is done to generate high quality long-range ordered oxides on the surface of the substrate (108). This happens by controlling the exposure of oxidizing agent as determined by Langmuirs, sticking coefficient of oxidizer towards the substrate (108), etc. This ordered native oxide constitutes the interface layer. Oxidizing agent is introduced into the processing chamber (101) via e.g. leak valve (113) or via gas manifold lines (111)
512. Substrate (108) temperature lowered to ALD growth requirement: the substrate (108) temperature is adapted for the ALD growth process.
513. Processing chamber (101) pressure and wall temperature adjusted for ALD growth step
514. ALD growth
515. The pressure in the processing chamber (101) and load lock (102) are adjusted to be in similar level. This is done with the corresponding pumping systems (105, 106)
516. Gate valve (103) opens
517. Substrate (108) transferred from processing chamber (101) to load lock (102)
518. Gate valve (103) closes
519. Load lock (102) is vented to reach atmospheric pressure.
520. Sample (108) is removed from load lock (102)

Detailed Process

A sample (108) i.e. substrate, for example a compound semiconductor, is introduced into a loading chamber or load lock (102) through a door, e.g. fast entry doors, and placed onto a sample holding mechanism. This holding mechanism could be designed to hold one or multiple samples, so that the load lock (102) will need to be opened less often. Once the sample(s) (108) are introduced and the door is closed, the pressure of the loading chamber (102) is lowered to reach the required vacuum conditions. This is done by a pumping system (106) that could include e.g. pumps, valves, pressure gauges, gas lines.

In the loading chamber (102), there could be a heating mechanism composed for example of IR lamps that will raise the temperature of the samples, while in high vacuum conditions, to a temperature high enough to evaporate the humidity or water present in the samples (108). This step is known as an annealing in vacuum and/or degassing step. Such step will help to reduce, for example, the process time required to achieve the right vacuum levels in the processing chamber (101).

Once the vacuum level of the load lock (102) reaches the required vacuum level present in the processing chamber (101), the gate valve (103) between the chambers is opened.

A transfer mechanism (107) will take one sample (108) from the holding mechanism in the load lock (102) and transfer it to a holding mechanism (116) in the processing chamber (101).

Then the transfer mechanism (107) is retracted out of the processing chamber (101), and the gate valve (103) is closed.

The temperature of the sample (108) is then modified by a heating element (109) located for example within the holding mechanism (116) to reach the desired temperature to apply the preparation step.

The pressure of the processing chamber (101) is also adjusted via a pumping system (105) to reach or to keep the required vacuum level, specific for each preparation process sub step. The pumping system (105) connected to the processing chamber (101) could include for example, turbo molecular pumps (105A) to reach high vacuum levels, gate valves, gas lines, valves, and additional pumps (105B) to enable the purge of gases or excess of precursors used during the ALD process.

The preparation step could consist of different sub steps, for example use of remote plasma containing, for example Argon, Hydrogen, Nitrogen that are provided to the plasma source (110) via some gas delivery system (111) that could contain different types of valve and flow control mechanisms, e.g. mass flow controllers. Plasma is generated via a Radio Frequency plasma source (110) while keeping the sample (108) at a certain temperature. This sub step could remove amorphous native oxides from the substrate (108). The use of plasma could also help to remove preferentially certain compounds, materials from the surface, in order to obtain a specific stoichiometry that will benefit the subsequent passivation step.

Another preparation sub step could consist of depositing or growing certain metallic element on the substrate surface, for example, making use of chemical precursors (for example trimethylgallium $Ga(CH_3)_3$, trimethylindium $In(CH_3)_3$) at certain temperature and pressure levels. Precursors could be injected via dedicated precursor injector lines (112). To the people expert in the art, this is a well-known set up used in, for example, ALD reactors or Metal Organic Chemical Vapour Deposition (MOCVD) equipment.

The deposition of the metal could be done also by well-known physical vapour deposition processes, such as effusion cells, pulsed laser deposition, sputter deposition, thermal evaporation, or electron beam evaporator.

Another way of modifying the stoichiometry could be to perform high temperature annealing under at least high vacuum conditions. The temperature of the substrate (108) is regulated via the heater element (109). During this process, and due to the different evaporation temperature limits for each constituent element of the compound semiconductor, it is possible to modify the surface composition of the material by forcing some elements to evaporate.

During each sub-step of the preparation step, the vacuum and temperature conditions of the chamber (101) are regulated and controlled, as well as the temperature of the sample (108). The processing chamber (101) wall temperature is controlled via some cooling/heating mechanism (104).

After the preparation step, the pressure and chamber wall temperature are readjusted to the required levels to proceed to the passivation step.

The passivation step is done by controlling the amount of oxidizer exposure to the processing chamber (101) and to the substrate (108), while keeping the substrate temperature at the required level. The oxidizer exposure is defined by Langmuirs (L), and it is determined by the oxidizer reactivity and by the substrate surface reactivity towards the oxidizer. In one embodiment the oxidizer exposure could be manifested, for example via insertion of molecular oxygen gas to the processing reactor (101). In another embodiment, the oxidizer could be atomic oxygen generated by radio frequency plasma source (110). Yet in another embodiments the oxidizer could be hydrogen peroxide (H2O2) vapour, carbon monoxide (CO), carbon dioxide (CO2), nitrogen monoxide (NO), nitrogen dioxide (NO2) The oxidizer dosing can be achieved for example via a leak valve (113) or mass-flow-controller (MFC). While controlling the sample substrate (108) temperature and oxidizer exposure, it is possible to generate the long-range ordered oxides on the sample's surface. This could be monitored by using for example Reflection high energy electron diffraction (RHEED), Low energy electron diffraction (LEED) ellipsometer or reflectance anisotropy spectroscopy (RAS) equipment installed in the processing chamber (101). These techniques are used to characterize the surface structure, orientation, and roughness of crystalline materials. It is known in the art that different materials will require different process parameters, and that such processes might require an initial chamber base pressure in the Ultra High Vacuum level.

Once the passivation layer is formed, the substrate (108) temperature is lowered to the required levels to proceed with the ALD growth, determined by the target material to be grown and the precursors used. At the same time, the processing chamber (101) wall temperature is raised to reach the required levels to prevent the precursors condensation and non-ALD growth in the chamber walls. Also, the vacuum level is adjusted to the required level typically used in the ALD growth. This can be achieved for example by introducing inert gas (such as N2, Ar etc.) to the processing chamber (101).

In one embodiment, the pressure in the processing chamber (101) is adjusted to match the required conditions by the ALD growth so that, when being in the UHV regime the valves to the pumps will be closed and the first ALD precursor pulse is introduced to the chamber (101) (which is still in UHV range).

Figure 3:
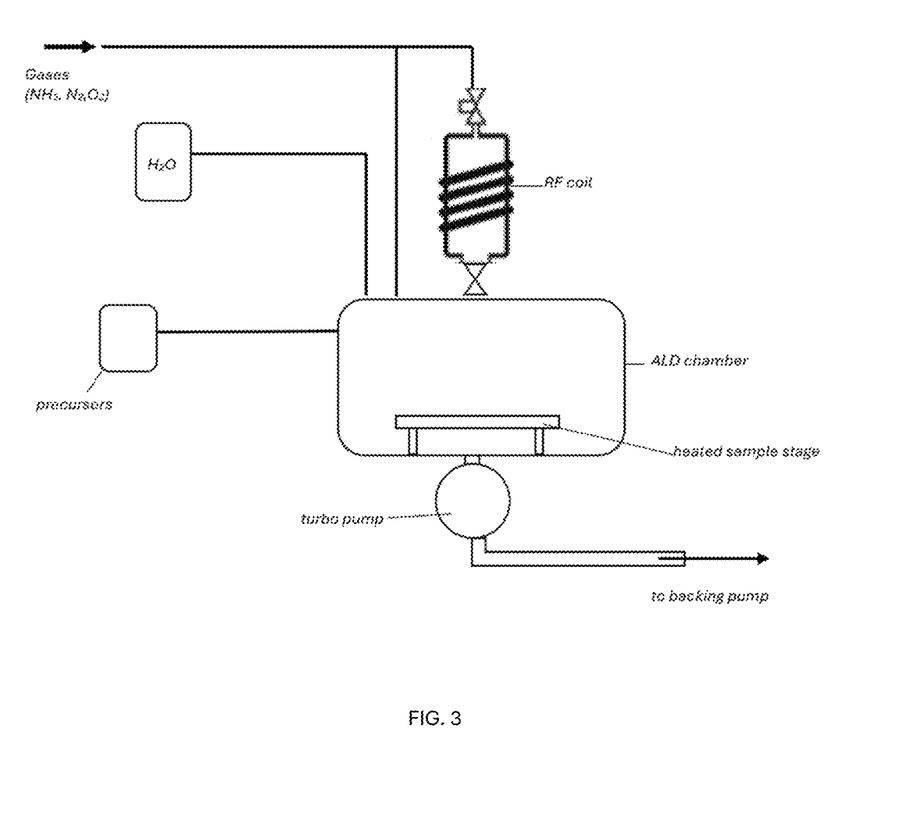
FIG. 3: shows a diagram of a conventional Atomic Layer Deposition reactor.

ALD growth is done by using the precursor injector lines (112) and other required components that are mounted onto the processing chamber (101), such as plasma source (110) or inert gas lines manifolds (111). The components needed to perform ALD growth are well known in the industry. A simple schema is shown in FIG. 3.

After the ALD growth has been done, the pressure of the processing chamber (101) is adjusted to match the pressure of the load lock (102). Once those are equal, the gate valve (103) is opened, and the sample (108) is transferred to the holding mechanism in the load lock (102) by the transfer mechanism (107).

Then the gate valve (103) is closed, and the pressure of the load lock (102) is adjusted to reach atmospheric pressure, via the pumping system (106) that includes some venting mechanism, for example nitrogen line and leak valve.

Once the pressure matches the atmosphere, the load lock (102) can be opened, and the sample (108) can be removed.

These three processes happen in a single processing chamber (101), which is designed to work under ultra-high vacuum conditions (UHV), and which is equipped with necessary components to perform the three processing steps. In order to achieve UHV pressure levels the processing chamber needs to be designed using components and connections that are designed to achieve that, for example the use of standard conflat flanges and conflat gaskets, to make the connection of components to the processing chamber, as well as the use of valves, gate valves and/or other components which are designed and built with appropriate sealings and gaskets to work under UHV pressure levels. Components, gasket, and flanges used to achieved UHV pressure levels are well known in the industry.

Figure 7:
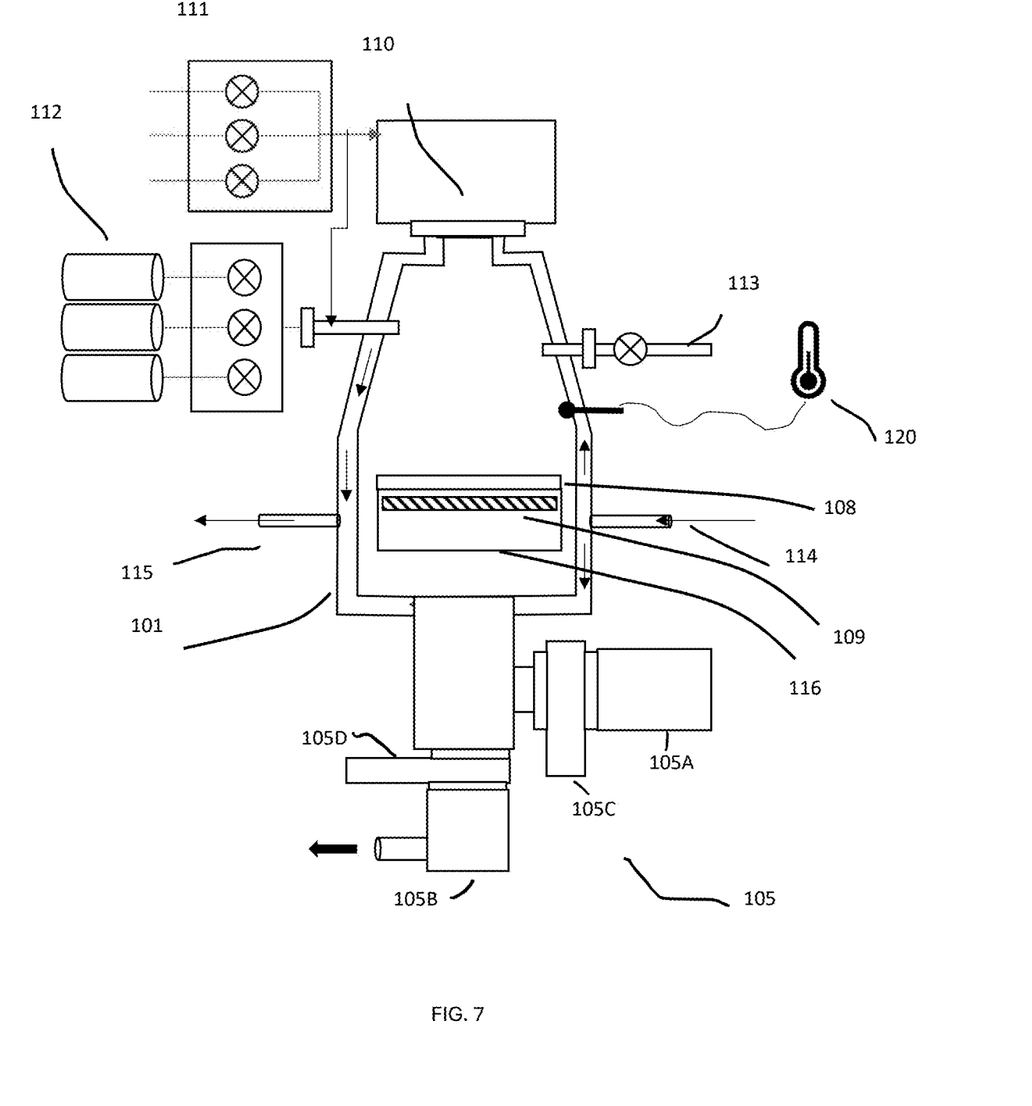
FIG. 7: shows a schematic of a processing chamber with basic components needed to perform the full process.

The processing chamber (101) is connected to a load lock (102) and separated via a gate valve (103). There is a transfer mechanism (107) to move the substrate (108) from the load lock (102) to the processing chamber (101) and vice versa while keeping the (required) vacuum conditions. (FIG. 7)

Both processing chamber (101) and load lock (102), have their own pumping units/systems (105, 106). These pumping units are used to achieve the required vacuum levels in the processing and load lock chambers (101, 102).

The load lock (102) should include at least:
1. A substrate holding mechanism that could hold a single substrate (108) or multiple substrates, e.g. a cassette mechanism to hold multiple substrates.
2. A pumping unit (106) to modify and achieve the required vacuum level. This pumping unit (106) could include a turbomolecular pump, vent valves, gate valves and other pressure regulating mechanisms.
3. A door to introduce the samples (108) into the load lock (102).

In another embodiment, the load lock (102) could also include a sample heating system e.g. IR lamps, to heat up the samples (108) after loading them, so that an initial degas/annealing process happens to get rid of adsorbed water etc. before transferring the substrates to the processing chamber (101). This will help to achieve the required vacuum levels faster.

The processing chamber (101) includes at least:
1. A substrate fixture (116) where the substrate (108) will be transferred from the load lock (102) via the transfer mechanism (107).
2. A substrate heating element (109), that modifies the substrate temperature according to the process requirements.
3. A substrate temperature measurement element, for example a thermocouple, a pyrometer, or a band edge thermometer.
4. Pumping system (105) to achieve the required vacuum levels (105A), and also to evacuate the residual gases and precursors during the ALD growth process. (105B)
5. Chamber wall temperature control system (104) that modifies the chamber wall temperature to the required level for a particular process step.
6. A gas delivery system (111) to provide different types of gases for all the process steps. This system could include for example regulating valves, mass flow controllers etc. to ensure the accurate dosing of such gases.
7. A precursor/chemicals delivery system (112) to provide the required chemicals during preparation and ALD growth processes.

In one embodiment, the processing chamber (101) also includes an RF plasma source (110) or a thermal cracker to perform preparation step, for example, native oxide removals, or to produce oxygen plasma during the passivation step, or to enable plasma enhanced ALD growth.

Yet in other embodiments the processing chamber (101) could include LEED system, RHEED, ellipsometer or reflectance anisotropy spectroscopy (RAS) equipment to monitor the surface crystal quality.

The substrate (108) temperature measurement element could be, for example, a thermocouple. In another embodiment, the substrate temperature measurement could be done with an IR thermal camera mounted outside of the processing chamber (101) and focused on the substrate (108) via a window in the chamber. In another embodiment the substrate (108) temperature can be determined using optical spectrometer, band-edge-thermometer, or pyrometers.

The processing chamber (101) is designed so that the wall temperature can be modified during the processes, either by cooling or by heating. In one embodiment this is done by using a dual wall processing chamber (101), where a cooling/heating liquid could be circulated; the liquid is delivered by a heating/cooling equipment (104), and the temperature of the chamber walls can be measured with some temperature measurement element (120), for example thermocouples.

Figure 8:
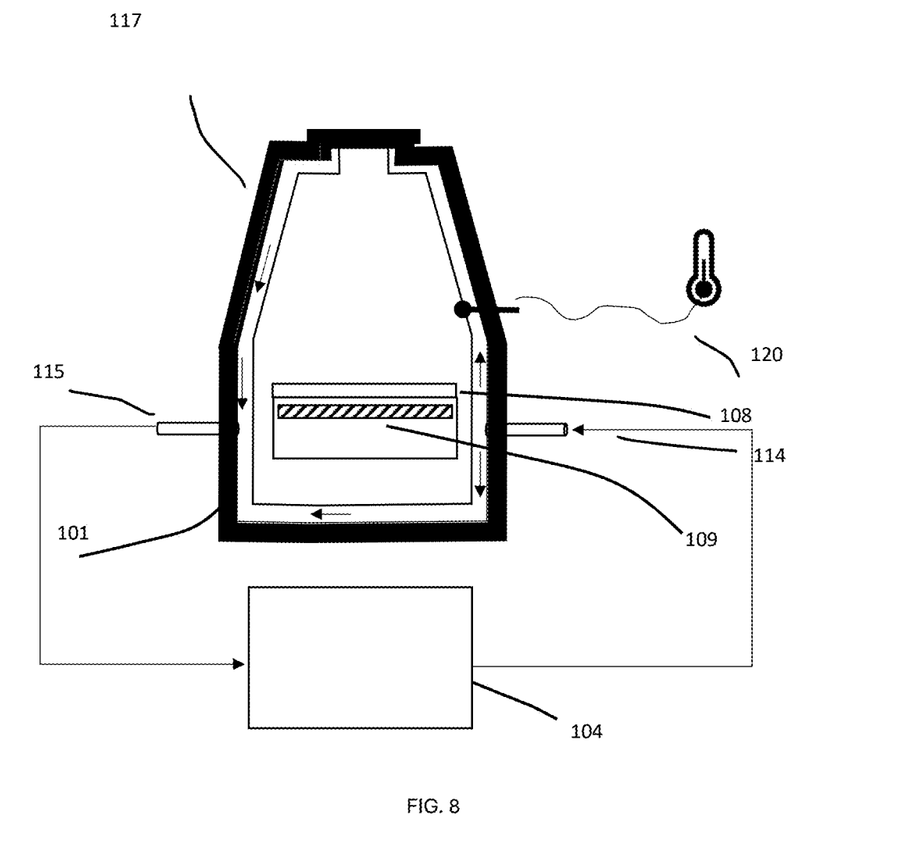
FIG. 8: shows a schematic of a processing chamber with a wall temperature control solution.

In another embodiment, the wall temperature control system is made by combining different cooling and heating systems. For example, the cooling of the chamber is done via circulating a cooling fluid (114, 115) either through the double wall, or through fluid channels built within the chamber walls. The heating of the chamber is done via separate heating elements placed on the processing chamber (101) walls. These could be, for example, heating tapes, or heating jackets (117), that cover sufficient wall surface of the chamber to achieve the required wall temperatures distribution. Both solutions are well known in the industry.

The pumping system (105) of the processing chamber (101) could include several pumps, for example turbomolecular pumps (105A), cryopumps, ion getter pumps, diffusion pumps, titanium sublimation pumps to achieve up to ultra-high vacuum conditions, gate valves (105C, 105D) to isolate the pumps during certain process steps, additional pumps (105B) for the evacuation of the residual gases during the ALD process, etc.

Figure 9:
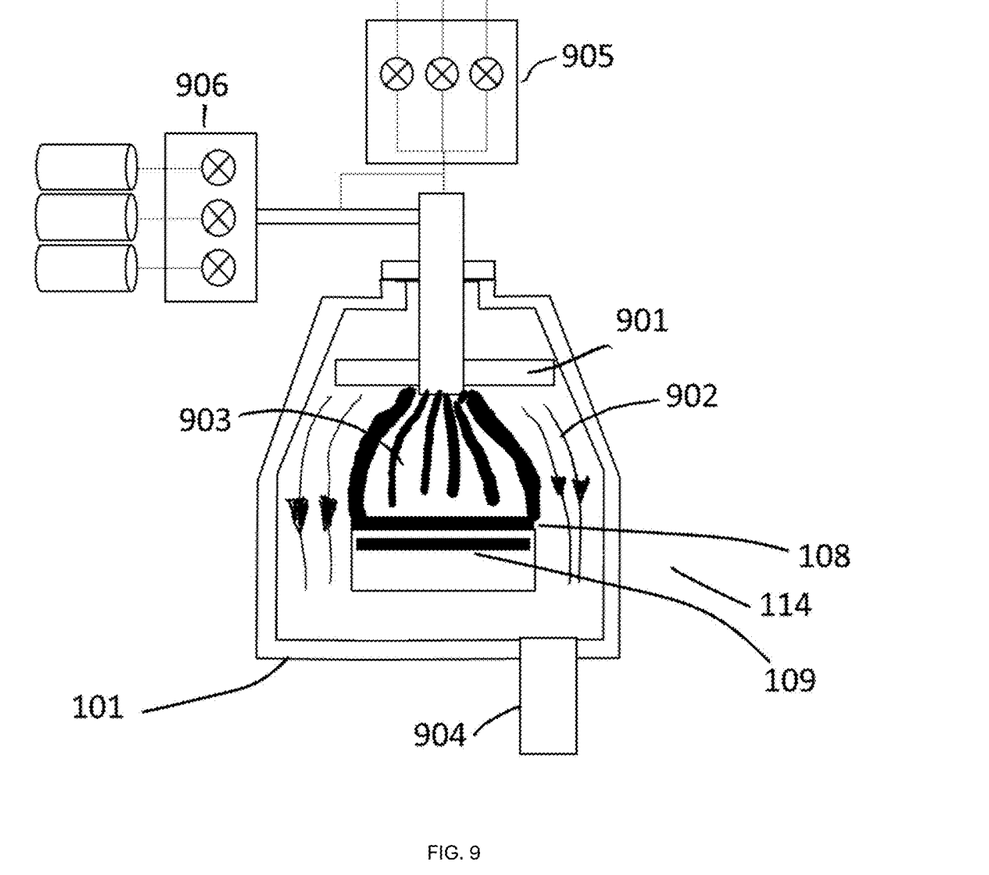
FIG. 9: shows a schematic of an approach to avoid condensation of ALD precursors in the walls of the processing chamber by using an inert gas curtain around the precursor gases.

In one embodiment, the processing chamber (101) design could include the use of certain techniques to prevent excessive contamination (material growth, precursor condensation) on the walls during the ALD process. For example, a known technique is to use an inert gas curtain (902) around the ALD reactive gases and precursors (903), so that excess of those will not reach the chamber walls, but that will go to the pumping/exhaust unit. (904) This can be achieved with, for example, a gas distribution head (901), that will circulate inert gas provided by a gas delivery system (905) on the exterior areas while the precursors provided by a precursor delivery system (906) and using some carrier gas, for example Ar, are introduced through the inner areas of the head (901). The pressures and volumes of the inert gas curtain are selected in a way that it can create a barrier to prevent the expansion of the precursors and chemicals through it (FIG. 9).

Figure 10:
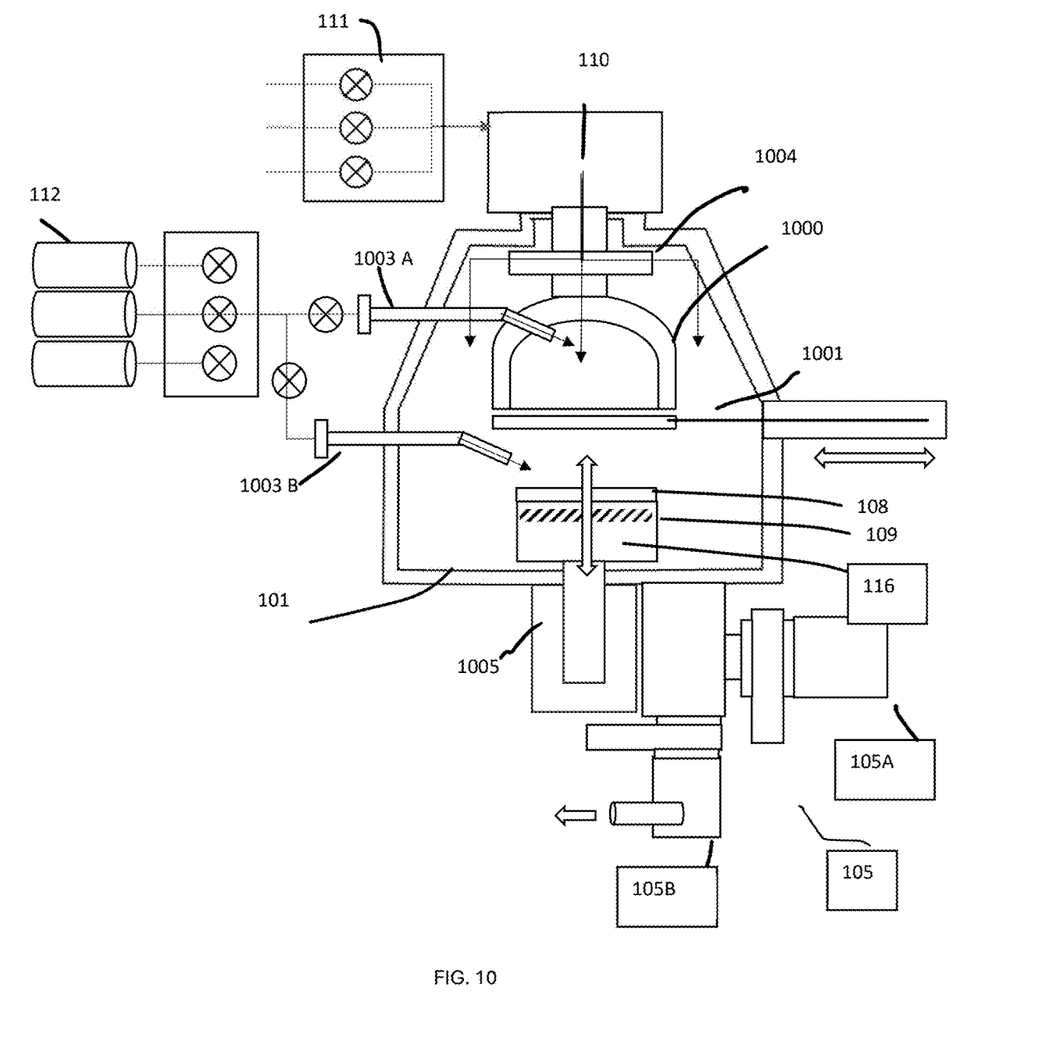
FIG. 10: shows a schematic of a processing chamber with an inner enclosure used to create a smaller processing environment during the ALD growth, and a movable/retractable substrate holder mechanism to approach or separate the substrate to the inner enclosure.

In another embodiment (FIG. 10) the processing chamber (101) will include an internal protection/enclosure (1000) that creates a smaller enclosure around the substrate (108) when the ALD process takes place, protecting the main processing chamber (101) walls from the condensation or growth of precursors. The substrate holder (116) and substrate heater (109) assembly could be mounted onto a linear shift mechanism (1005) so that the assembly could be approached towards the enclosure (1000). The precursor delivery systems (112) could have two individual inlets with correspondent valves, one (1003A) to provide precursors inside of the enclosure and other (1003B) to provide precursors outside of the enclosure towards the substrate (108) when is in the retracted position. The plasma source (110) could also have two different plasma inlet areas (1004) one directing the plasma to the inside of the enclosure, and other to direct the plasma to other areas of the processing chamber (101) When the ongoing process is not ALD growth, the substrate holder (116) will be in the retracted position, so that there is some distance between the substrate (108) and enclosure (1000), and a moving shielding element (1001) could protect the enclosure (1000) from the heat source/hot substrate (108, 109). This moving shield (1001) will prevent the heating up of the inner surfaces of the enclosure (1000) and therefore degassing of the contaminated walls from the enclosure.

What is claimed is:

1. A method for processing a surface of a substrate, the method being carried out in an apparatus with a single processing chamber in which all processing steps take place, the method comprising the following processing steps:
   a preparation step comprising treating a surface of the substrate to reduce contamination, carbon, hydrocarbons, water, and/or amorphous native oxides from the surface of the substrate;
   a surface passivation step comprising an oxidation process configured to generate long-range ordered oxides on the surface of the substrate, wherein the long-range-ordered oxides are crystalline structures and exhibit translational symmetry similar or different compared to the substrate;
   an ALD growth step comprising growing a thin film by atomic layer deposition;
   wherein the single processing chamber comprises at least a substrate holding mechanism, a substrate heating element, a pumping system to provide the vacuum and regulate the pressure of the processing chamber and provide the exhaust system of gases and precursors during the processing steps, a chamber wall temperature regulation system, a gas delivery system, and a precursor delivery system.

2. The method according to claim 1, wherein the method further comprises adjusting process conditions between each processing step, where at least a substrate temperature, a processing chamber pressure and a processing chamber wall temperature are adjusted to levels required by each processing step.

3. The method according to claim 1, wherein the preparation step further comprises at least one or more of the following:
   a Dry-etching process to remove amorphous native oxides;
   annealing the substrate in a vacuum to remove adsorbed water and volatile atomic species from the surface of the substrate; and
   a surface stoichiometry modification step to obtain a specific concentration of elements at the surface of the substrate.

4. The method according to claim 1, wherein the preparation step comprises annealing the substrate in a vacuum to remove adsorbed water and volatile atomic species from the surface of the substrate.

5. The method according to claim 3, wherein the surface stoichiometry modification step consists in depositing a metal component to modify the substrate stoichiometry to have a higher concentration of elements to achieve a long-range ordered oxide in the surface passivation step.

6. The method according to claim 5, wherein the deposition of the metal component is done by introducing a chemical metal precursor in the processing chamber.

7. The method according to claim 5, wherein the deposition of the metal component is done by physical vapour deposition.

8. The method according to claim 3, wherein the stoichiometry modification step comprises only an annealing step of the substrate under vacuum conditions.

9. The method according to claim 1, wherein the method further comprises using an inert gas curtain around ALD reactive gases and precursors to prevent an excess of the ALD reactive gases and precursors to reach a wall of the single processing chamber.

10. The method according to claim 1, wherein the substrate contains compound semiconductor material.

* * * * *